United States Patent
Jung et al.

(10) Patent No.: US 7,030,022 B2
(45) Date of Patent: Apr. 18, 2006

(54) METHOD OF MANUFACTURING SEMICONDUCTOR DEVICE HAVING METAL INTERCONNECTIONS OF DIFFERENT THICKNESS

(75) Inventors: Mu-kyoung Jung, Seoul (KR); Kyung-tae Lee, Yongin (KR)

(73) Assignee: Samsung Electronics Co., Ltd., (KR)

( * ) Notice: Subject to any disclaimer, the term of this patent is extended or adjusted under 35 U.S.C. 154(b) by 284 days.

(21) Appl. No.: 10/655,423

(22) Filed: Sep. 4, 2003

(65) Prior Publication Data
US 2004/0048476 A1    Mar. 11, 2004

(30) Foreign Application Priority Data
Sep. 10, 2002    (KR)    .................. 10-2002-0054605

(51) Int. Cl.
*H01L 21/302*    (2006.01)
(52) U.S. Cl. .................. 438/696; 438/700; 438/706
(58) Field of Classification Search ............... 438/696, 438/700, 706
See application file for complete search history.

(56) References Cited

U.S. PATENT DOCUMENTS 6,225,207 B1 *    5/2001    Parikh .................. 438/622

2003/0001266 A1*    1/2003    Hu .......................... 257/758

FOREIGN PATENT DOCUMENTS

JP    10340952    12/1998
KR    2000-0043060    7/2000

* cited by examiner

*Primary Examiner*—Nadine G. Norton
*Assistant Examiner*—Binh X. Tran
(74) *Attorney, Agent, or Firm*—Mills & Onello LLP

(57) ABSTRACT

Provided is a method of manufacturing a semiconductor device having a first region, in which a capacitance component is a dominant cause of a RC delay, and a second region, in which a resistance component is a dominant cause of a RC delay. The method comprises performing a first etching process to an insulating layer formed on a semiconductor substrate, so that a first trench having a first thickness and a second trench having the first thickness are formed in the first region and the second region, respectively; performing a second etching process to the second trench, so that a third trench having a second thickness thicker than the first thickness is formed in the second region; filling the first trench and the third trench with a metal layer; and removing portions of the metal layer, so that a first metal interconnection and a second metal interconnection are formed inside of the first trench and the third trench, respectively.

14 Claims, 3 Drawing Sheets

METHOD OF MANUFACTURING SEMICONDUCTOR DEVICE HAVING METAL INTERCONNECTIONS OF DIFFERENT THICKNESS

BACKGROUND OF THE INVENTION

This application claims the priority of Korean Patent Application No. 2002-54605 filed on Sep. 10, 2002, in the Korean Intellectual Property Office, the contents of which are incorporated herein in their entirety by reference.

1. Field of the Invention

The present invention relates to a method of manufacturing a semiconductor device, and more particularly, to a method of manufacturing a semiconductor device having metal interconnections of different thicknesses using a damascene process.

2. Description of the Related Art

In a general method of manufacturing a semiconductor device, active elements and/or passive elements are formed on a semiconductor substrate, and then metal interconnections are formed over the active elements and/or passive elements. As integration densities of semiconductor devices increase, the metal interconnections have begun to be formed in a multilayer configuration. Insulating layers are interposed between the multilayered metal interconnections, and the multilayered metal interconnections are electrically connected by a via-contact through the insulating layers.

In the semiconductor device including the multilayered metal interconnections, many problems due to electric coupling between the adjacent metal interconnections occurs. Among many problems, a typical problem greatly affecting the operation speed of the semiconductor device is RC delay. Since the operation speed of the semiconductor device becomes slower as the RC delay becomes larger, it is preferable to reduce the RC delay.

Factors that affect the RC delay are resistances of the metal interconnections and capacitances of the insulating layers interposed between the metal interconnections. Resistivities of materials of the metal interconnections, widths of the metal interconnections, lengths of the metal interconnections, and the like, are variables that can affect the resistances of the metal interconnections. Dielectric constants of materials of the insulating layers, thicknesses of the insulating layers, and the like, are variables that can affect the capacitances of the insulating layers.

However, a semiconductor device may include a region where the capacitances of the insulating layers interposed between the metal interconnections are a dominant cause of RC delay and a region where the resistances of the metal interconnections are a dominant cause of the RC delay. Therefore, in a case where the factors affecting the RC delay differ locally, the RC delay must be minimized by adjusting the factors affecting the RC delay locally, i.e., according to the regions. For example, the RC delay can be minimized in a region where the capacitances of the insulating layers are the dominant cause of the RC delay by increasing the thicknesses of the insulating layers, and in this respect, the thicknesses of the metal interconnections are necessarily decreased. In contrast, the RC delay can be minimized in the region where the resistances of the metal interconnections are the dominant cause of the RC delay by increasing the thicknesses of the metal interconnections, and in this respect, the thicknesses of the insulating layers are necessarily decreased. Thus, in order to minimize the RC delay, it is desirable to differ the thicknesses of the metal interconnections in a single process, in order to have an efficient device fabrication process.

SUMMARY OF THE INVENTION

The present invention provides a method of manufacturing a semiconductor device having metal interconnections of different thicknesses through the use of a single process of manufacturing metal interconnections.

According to an aspect of the present invention, there is provided a method of manufacturing a semiconductor device having a first region in which a capacitance component is a dominant cause of a RC delay, and a second region in which a resistance component is a dominant cause of a RC delay. The method comprises performing a first etching process to an insulating layer formed on a semiconductor substrate, so that a first trench having a first thickness and a second trench having the first thickness are formed in the first region and the second region, respectively; performing a second etching process to the second trench, so that a third trench having a second thickness thicker than the first thickness is formed in the second region; filling the first trench and the third trench with a metal layer; and removing portions of the metal layer, so that a first metal interconnection and a second metal interconnection are formed inside of the first trench and the third trench, respectively.

It is preferable that the metal layer be formed using copper.

It is preferable that the metal layer of copper be formed using an electroplating method.

It is preferable that the portions of the metal layer be removed using chemical mechanical polishing (CMP).

According to another aspect of the present invention, there is provided a method of manufacturing a semiconductor device having a first region, in which a capacitance component is a dominant cause of a RC delay, and a second region, in which a resistance component is a dominant cause of a RC delay. The method comprises forming a mask layer on an insulating layer formed on a semiconductor substrate; forming a first photoresist layer pattern on the mask layer, so that a portion of the mask layer formed in the first region and a portion of the mask layer formed in the second region are exposed; performing a first etching process using the first photoresist layer pattern as an etching mask, so that a mask layer pattern, in which the first region and the second region are exposed, is formed, and a first trench having a first thickness and a second trench having the first thickness are formed in the first region and the second region, respectively; removing the first photoresist layer pattern; forming a second photoresist layer pattern, with which the first trench of the first region is covered and in which the second trench and portions of the mask layer pattern are exposed; performing a second etching process using the second photoresist layer pattern and the mask layer pattern as an etching mask, so that a third trench having a second thickness thicker than the first thickness is formed in the second region; removing the second photoresist layer pattern; filling the first trench and the third trench with a metal layer; and removing portions of the metal layer, so that a first metal interconnection and a second metal interconnection are formed inside of the first trench and the third trench, respectively.

It is preferable that the metal layer be formed using copper.

It is preferable that the metal layer of copper be formed using an electroplating method.

It is preferable that the portions of the metal layer be removed using chemical mechanical polishing (CMP).

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
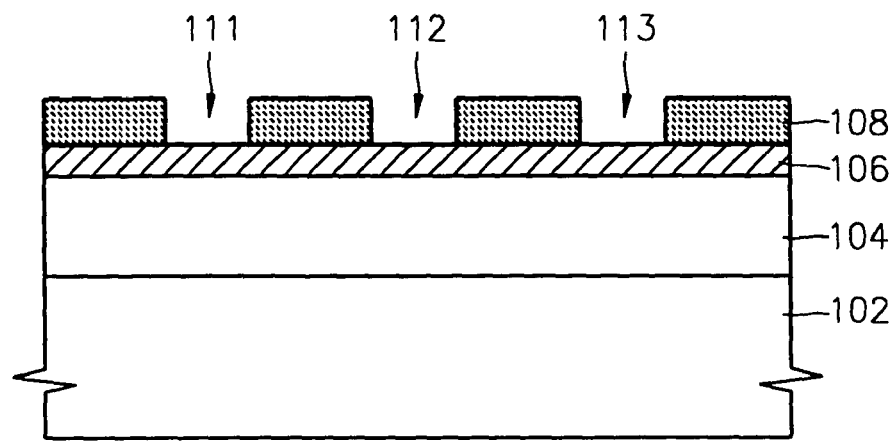
FIGS. 1 through 7 are cross-sectional views illustrating a method of manufacturing a semiconductor device according to the present invention.

Referring to FIG. 1, an insulating layer 104 is formed on a semiconductor substrate 102. Although it is not shown in FIG. 1, a plurality of impurity regions may be formed within the semiconductor substrate 102, and other material layers may be formed between the semiconductor substrate 102 and the insulating layer 104. Further, the insulating layer 104 may include a plurality of insulating layers. After forming the insulating layer 104, a mask layer 106 is formed on the insulating layer 104. A photoresist layer pattern 108 is formed on the mask layer 106. The photoresist layer pattern 108 has first to third openings 111, 112, and 113 provided for exposing portions of a surface of the mask layer 106. A relatively thin metal interconnection will be formed in the first and third openings 111 and 113, and a relatively thick metal interconnection will be formed in the second opening 112.

Figure 2:
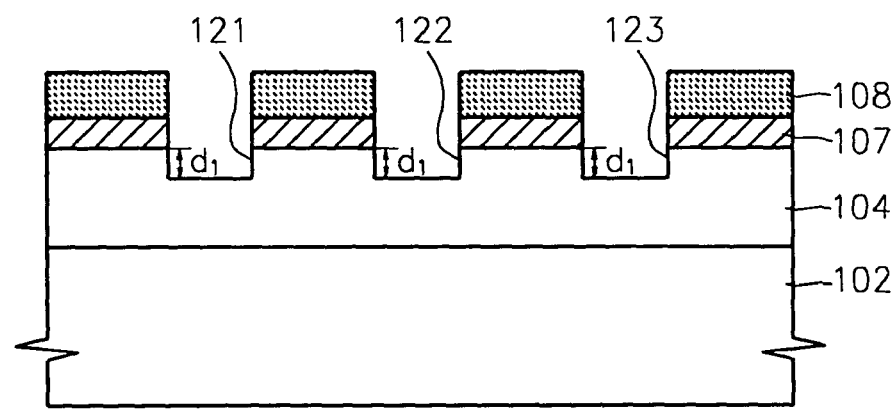

Referring to FIG. 2, a first etching process is performed using the photoresist layer pattern 108 as an etching mask so that portions of the mask layer 106 and the insulating layer 104 are removed sequentially. After the first etching process, a mask layer pattern 107 is formed, and first to third trenches 121, 122, and 123 having a first thickness or depth d1 are formed in the insulating layer 104.

Figure 3:
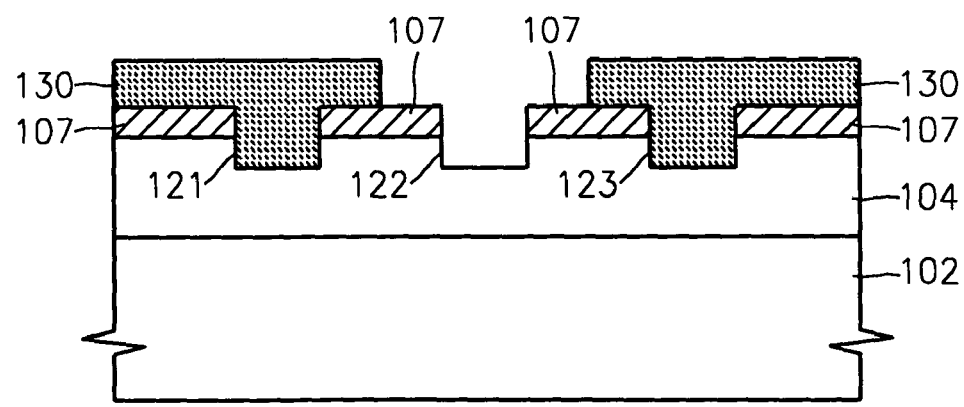

Referring to FIG. 3, after the photoresist layer pattern 108 (refer to FIG. 2) is removed, a photoresist layer pattern 130 is formed. While the photoresist layer pattern 130 covers the first and third trenches 121 and 123, the second trench 122 and portions of the mask layer pattern 107 surrounding the second trench 122 are exposed so as not to be covered by the photoresist layer pattern 130.

Figure 4:
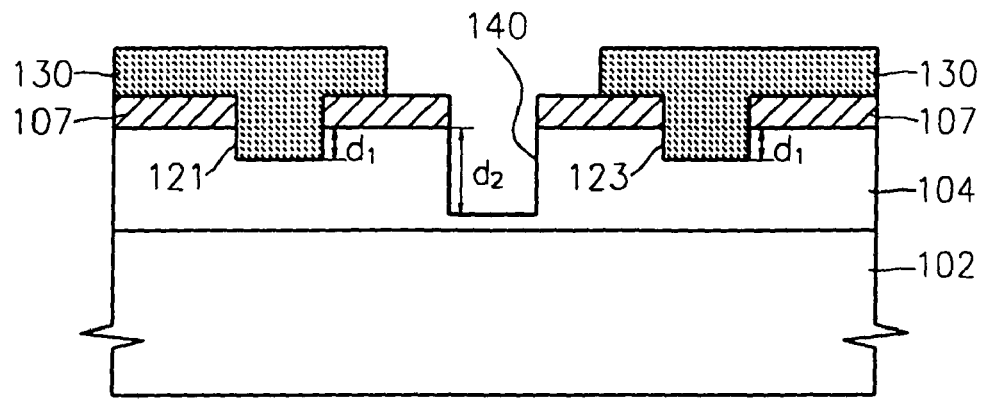

Referring to FIG. 4, a second etching process is performed using the photoresist layer pattern 130 and the exposed portions of the mask layer pattern 107 as an etching mask, so that a portion of the exposed insulating layer 104 is removed. After the second etching process, a fourth trench 140 having a second depth d2 than the first depth d1 is formed in the insulating layer 104. Since the first and third trenches 121 and 123 are covered with the photoresist layer pattern 130 during the second etching process, the first and third trenches 121 and 123 are not affected by the second etching process so that the depths of the first and third trenches 121 and 123 are maintained to the first depth d1.

Figure 5:
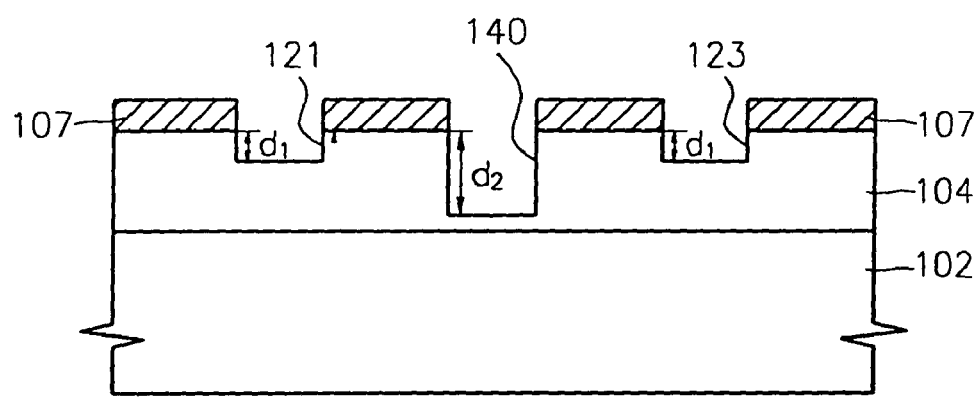

Referring to FIG. 5, the photoresist layer pattern 130 (refer to FIG. 4) is removed. Thus, the mask layer pattern 107 is exposed, and simultaneously the first and third trenches 121 and 123 of the first depth d1 and the fourth trench 140 of the second depth d2 are exposed.

Figure 6:
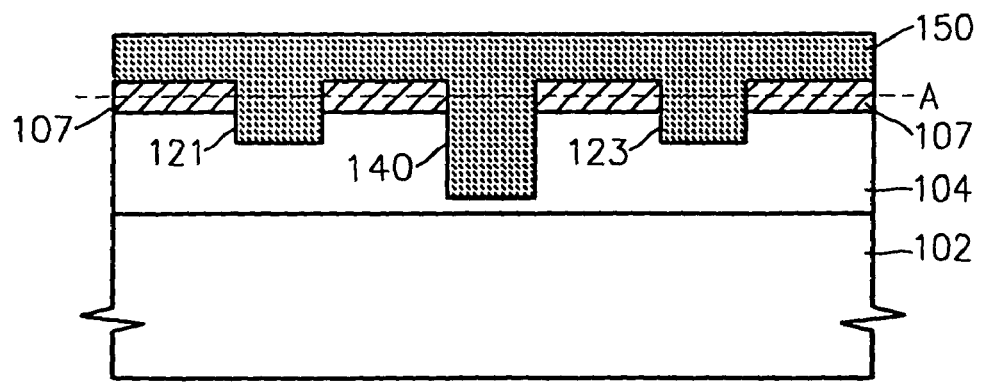

Referring to FIG. 6, a metal layer 150 is formed on the mask layer pattern 107 and the insulating layer 104, in order to fill the first and third trenches 121 and 123 and the fourth trench 140. The metal layer 150 may be formed using copper (Cu) having a relatively low resistivity of 1.7 $\mu\Omega^-$ cm. The metal layer 150 can be formed by an electroplating (EP) method using a Cu seed layer. However, the method of forming the metal layer 150 is not limited thereto and the metal layer 150 can be formed by other methods.

Figure 7:
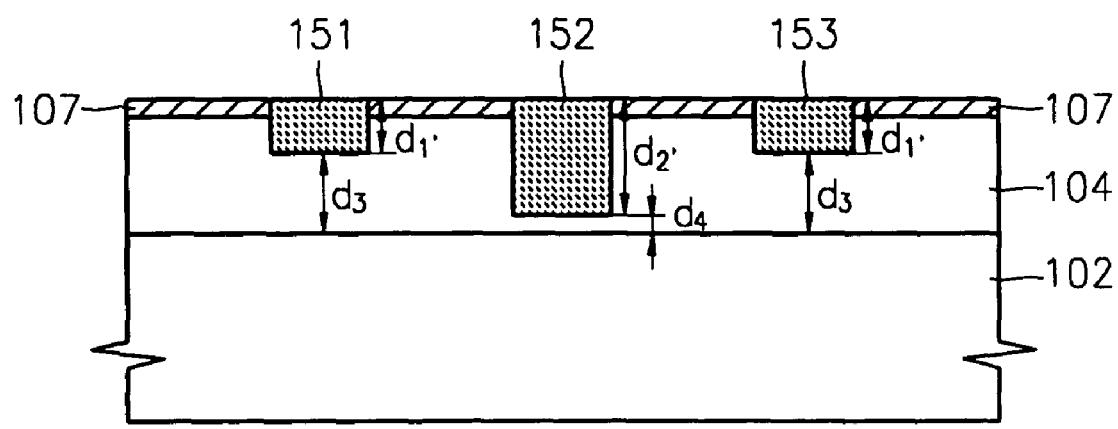

Next, a planarization process is performed in order to remove the resulant structure up to a dotted line A of FIG. 6. The planarization process can be performed using chemical mechanical polishing (CMP). Due to the planarization process, the mask layer pattern 107 is exposed, and the metal layer 150 covering the mask layer pattern 107 is removed. Thus, as shown in FIG. 7, a first metal interconnection 151, a second metal interconnection 152 and a third metal interconnection 153, which are separated from one another, are completed. Thickness d1' of the first and third metal interconnections 151 and 153 are less than the thickness d2' of the second metal interconnection 152. Thickness d3 of the insulating layer 104 under the first and third metal interconnections 151 and 153 having the relatively thin thickness is relatively thick. In contrast, thickness d4 of the insulating layer 104 under the second metal interconnection 152 having the relatively thick thickness is relatively thin.

As described above, according the present invention, since metal interconnections of different thicknesses are simultaneously formed, the metal interconnection of the relatively thin thickness is formed in the region where a capacitance is a dominant cause of the RC delay, and the metal interconnection of the relatively thick thickness is formed in the region where a resistance is a dominant cause of the RC delay, thereby reducing the RC delay of the semiconductor device.

While the present invention has been particularly shown and described with reference to preferred embodiments thereof, it will be understood by those of ordinary skill in the art that various changes in form and details may be made therein without departing from the spirit and scope of the present invention as defined by the appended claims.

What is claimed is:

1. A method of manufacturing a semiconductor device having a first region, in which a capacitance component is a dominant cause of a RC delay, and a second region, in which a resistance component is a dominant cause of a RC delay, comprising:

performing a first etching process to an insulating layer formed on a semiconductor substrate, so that at least one first trench having a first depth and a second trench having the first depth are formed in the first region and the second region, respectively;

performing a second etching process to the second trench, so that a third trench having a second depth deeper than the first depth is formed in the second region, wherein the insulating layer has a first thickness under the third trench and a second thickness under the at least one first trench, the first thickness of the insulating layer under the third trench being less than the second thickness of the insulating layer under the at least one first trench;

filling the at least one first trench and the third trench with a metal layer; and removing portions of the metal layer, so that a first metal interconnection and a second metal interconnection are formed inside of the at least one first trench and the third trench, respectively.

2. The method of claim 1, wherein the portions of the metal layer are removed using chemical mechanical polishing (CMP).

3. The method of claim 1, wherein the metal layer is formed using copper.

4. The method of claim 3, wherein the metal layer of copper is formed using an electroplating method.

5. The method of claim 1, wherein the first region is formed on a first side and a second side of the second region, and wherein a trench of the at least one first trench is formed in the first region at each of the first side and the second side of the second region.

6. The method of claim 5, wherein each trench of the at least one first trench has the first depth, and wherein when the second etching process is performed to the second trench, the third trench has the second depth that is deeper than the first depth of each trench of the at least one first trench.

7. The method of claim 5, wherein the insulating layer has a first thickness under the third trench and a second thickness under each trench of the at least one first trench, the first thickness of the insulating layer under the third trench being less than the second thickness of the insulating layer under each trench of the at least one first trench.

8. A method of manufacturing a semiconductor device having a first region, in which a capacitance component is a dominant cause of a RC delay, and a second region, in which a resistance component is a dominant cause of a RC delay, comprising:

forming a mask layer on an insulating layer formed on a semiconductor substrate;

forming a first photoresist layer pattern on the mask layer, so that a portion of the mask layer formed in the first region and a portion of the mask layer formed in the second region are exposed;

performing a first etching process using the first photoresist layer pattern as an etching mask, so that a mask layer pattern, in which the first region and the second region are exposed, is formed, and at least one first trench having a first depth and a second trench having the first depth are formed in the first region and the second region, respectively;

removing the first photoresist layer pattern;

forming a second photoresist layer pattern, by which the at least one first trench of the first region is covered and by which the second trench and portions of the mask layer pattern are exposed;

performing a second etching process using the second photoresist layer pattern and the mask layer pattern as an etching mask, so that a third trench having a second depth deeper than the first depth is formed in the second region, wherein the insulating layer has a first thickness under the third trench and a second thickness under the at least one first trench, the first thickness of the insulating layer under the third trench being less than the second thickness of the insulating layer under the at least one first trench;

removing the second photoresist layer pattern;

filling the at least one first trench and the third trench with a metal layer; and removing portions of the metal layer, so that a first metal interconnection and a second metal interconnection are formed inside of the at least one first trench and the third trench, respectively.

9. The method of claim 8, wherein the portions of the metal layer are removed using chemical mechanical polishing (CMP).

10. The method of claim 8, wherein the metal layer is formed using copper.

11. The method of claim 10, wherein the metal layer of copper is formed using an electroplating method.

12. The method of claim 8, wherein the first region is formed on a first side and a second side of the second region, and wherein a trench of the at least one first trench is formed in the first region at each of the first side and the second side of the second region.

13. The method of claim 12, wherein each trench of the at least one first trench has the first depth, and wherein when the second etching process is performed to the second trench, the third trench has the second depth that is deeper than the first depth of each trench of the at least one first trench.

14. The method of claim 12, wherein the insulating layer has a first thickness under the third trench and a second thickness under each trench of the at least one first trench, the first thickness of the insulating layer under the third trench being less than the second thickness of the insulating layer under each trench of the at least one first trench.

* * * * *

UNITED STATES PATENT AND TRADEMARK OFFICE
CERTIFICATE OF CORRECTION

PATENT NO. : 7,030,022 B2  Page 1 of 1
APPLICATION NO. : 10/655423
DATED : April 18, 2006
INVENTOR(S) : Mu-kyoung Jung et al.

It is certified that error appears in the above-identified patent and that said Letters Patent is hereby corrected as shown below:

In Column 3, Line 56, insert --deeper-- after "d2".

Signed and Sealed this

Twenty-sixth Day of September, 2006

JON W. DUDAS
*Director of the United States Patent and Trademark Office*